US006894529B1

(12) United States Patent
Chong et al.

(10) Patent No.: US 6,894,529 B1
(45) Date of Patent: May 17, 2005

(54) IMPEDANCE-MATCHED OUTPUT DRIVER CIRCUITS HAVING LINEAR CHARACTERISTICS AND ENHANCED COARSE AND FINE TUNING CONTROL

(75) Inventors: Yew-Keong Chong, Duluth, GA (US); David J. Klein, Duluth, GA (US); XinXin Shao, Duluth, GA (US); Prashant Shamarao, Alpharetta, GA (US); Brian K. Butka, Alpharetta, GA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 44 days.

(21) Appl. No.: 10/616,272

(22) Filed: Jul. 9, 2003

(51) Int. Cl.⁷ ........................ H03K 17/16; H03K 19/003
(52) U.S. Cl. .............................. 326/30; 326/27; 326/86
(58) Field of Search ............................ 326/26, 27, 30, 326/82, 83, 86; 327/108, 112

(56) References Cited

U.S. PATENT DOCUMENTS

| | | | |
|---|---|---|---|
| 4,731,553 A | 3/1988 | Van Lehn et al. | |
| 4,829,199 A | 5/1989 | Prater | |
| 4,833,349 A | 5/1989 | Liu et al. ........................ 307/468 |
| 4,933,574 A | 6/1990 | Lien et al. | |
| 5,122,690 A | 6/1992 | Bianchi | |
| 5,153,450 A | 10/1992 | Ruetz ........................ 307/443 |
| 5,166,555 A | 11/1992 | Kano | |
| 5,293,082 A | 3/1994 | Bathaee | |
| 5,313,435 A | 5/1994 | Kim et al. | |
| 5,319,258 A | 6/1994 | Ruetz ........................ 307/443 |
| 5,497,105 A | 3/1996 | Oh et al. ........................ 326/27 |
| 5,528,192 A | 6/1996 | Agiman | |
| 5,559,447 A | 9/1996 | Rees | |
| 5,717,343 A | 2/1998 | Kwong | |
| 5,739,714 A | 4/1998 | Gabara | |
| 5,834,948 A | 11/1998 | Yoshizaki et al. | |
| 5,880,606 A | 3/1999 | Griesbach ........................ 326/86 |
| 5,892,371 A | 4/1999 | Maley | |
| 5,991,908 A | 11/1999 | Baxter et al. ........................ 714/727 |
| 6,014,046 A | 1/2000 | Douse et al. | |
| 6,031,394 A | 2/2000 | Cranford, Jr. et al. | |
| 6,057,710 A | 5/2000 | Singh | |
| 6,064,227 A | 5/2000 | Saito | |
| 6,071,314 A | 6/2000 | Baxter et al. ........................ 716/17 |
| 6,081,132 A | 6/2000 | Isbara | |

(Continued)

OTHER PUBLICATIONS

Fan et al., "On–Die Termination Resistors with Analog Impedance Control for Standard CMOS Technology," IEEE Journal of Solid–State Circuits, vol. 38, No. 2, Feb. 2003, pp 361–364.

*Primary Examiner*—Daniel D. Chang
(74) *Attorney, Agent, or Firm*—Myers Bigel Sibley & Sajovec PA

(57) ABSTRACT

Impedance-matched output driver circuits include a first totem pole driver stage and a second totem pole driver stage. The first totem pole driver stage includes at least one PMOS pull-up transistor and at least one NMOS pull-down transistor therein that are responsive to a first pull-up signal and a first pull-down signal, respectively. The second totem pole driver stage has at least one NMOS pull-up transistor and at least one PMOS pull-down transistor therein that are responsive to a second pull-up signal and second pull-down signal, respectively. The linearity of the output driver circuit is enhanced by including a first resistive element that extends between the first and second totem pole driver stages. The first resistive element has a first terminal, which is electrically coupled to drain terminals of the at least one PMOS pull-up transistor and the at least one NMOS pull-down transistor in the first totem pole driver stage, and a second terminal, which is electrically coupled to source terminals of the at least one NMOS pull-up transistor and the at least one PMOS pull-down transistor in the second totem pole driver stage.

21 Claims, 7 Drawing Sheets

U.S. PATENT DOCUMENTS

| | | | |
|---|---|---|---|
| 6,091,260 A | 7/2000 | Shamarao | |
| 6,118,310 A | 9/2000 | Esch, Jr. | 327/108 |
| 6,133,749 A | 10/2000 | Hansen et al. | 326/30 |
| 6,205,086 B1 * | 3/2001 | Hanzawa et al. | 365/233 |
| 6,208,168 B1 | 3/2001 | Rhee | 326/83 |
| 6,225,824 B1 | 5/2001 | Madhu et al. | |
| 6,242,942 B1 | 6/2001 | Shamarao | |
| 6,285,215 B1 | 9/2001 | Voshell | 326/86 |
| 6,316,977 B1 | 11/2001 | Sargeant | |
| 6,326,821 B1 | 12/2001 | Gabara | |
| 6,351,172 B1 | 2/2002 | Ouyang et al. | 327/333 |
| 6,353,346 B1 | 3/2002 | Chan | 327/112 |
| 6,356,102 B1 | 3/2002 | Klein et al. | |
| 6,362,656 B2 | 3/2002 | Rhee | 326/87 |
| 6,388,499 B1 | 5/2002 | Tien et al. | |
| 6,420,914 B1 | 7/2002 | Hasegawa | |
| 6,433,579 B1 | 8/2002 | Wang et al. | 326/38 |
| 6,437,599 B1 | 8/2002 | Groen | 326/63 |
| 6,456,124 B1 * | 9/2002 | Lee et al. | 327/108 |
| 6,509,770 B2 | 1/2003 | Gossmann et al. | |
| 6,529,082 B1 | 3/2003 | Boerstler et al. | |
| 6,552,565 B2 | 4/2003 | Chang et al. | 326/30 |
| 6,570,405 B1 | 5/2003 | Lien | |
| 6,604,227 B1 | 8/2003 | Foltin et al. | |
| 6,650,156 B1 | 11/2003 | Reid et al. | |
| 2001/0000949 A1 | 5/2001 | Rhee | 326/85 |

* cited by examiner

IMPEDANCE-MATCHED OUTPUT DRIVER CIRCUITS HAVING LINEAR CHARACTERISTICS AND ENHANCED COARSE AND FINE TUNING CONTROL

FIELD OF THE INVENTION

The present invention relates to integrated circuit devices and, more particularly, to output driver circuits that drive off-chip loads.

BACKGROUND OF THE INVENTION

Output driver circuits are frequently configured to have impedance matching characteristics that enable off-chip loads to be driven more efficiently. FIG. 1 illustrates a conventional impedance-matched output driver circuit 10 having a totem pole arrangement of PMOS pull-up transistors and NMOS pull-down transistors therein. As illustrated, a pull-up path of the driver circuit 10 includes a plurality of PMOS pull-up transistors, shown as MP0 and MP1, and a pull-down path of the driver circuit 10 includes a plurality of NMOS pull-down transistors, shown as MN0 and MN1. The PMOS pull-up transistor MP0, which is responsive to an active low input signal PUX, operates as a pass transistor that becomes active when an output terminal (OUT) of the driver circuit 10 is to be switched low-to-high. However, the PMOS pull-up transistor MP1 may comprise a plurality of parallel-connected PMOS transistors that are responsive to respective bits of a multi-bit pull-up control signal. This multi-bit pull-up control signal, which is an active low signal, is shown as PUX_CODE. In some cases, the plurality of parallel-connected PMOS transistors may represent an array of binary weighted transistors that are selectively enabled to match impedance characteristics of a load (not shown) connected to the output terminal OUT. The value of the pull-up control signal PUX_CODE may be updated periodically to maintain the impedance matching characteristics of the driver circuit 10.

The NMOS pull-down transistor MP0, which is responsive to an active high input signal PD, operates as a pass transistor that becomes active when an output terminal OUT of the driver circuit 10 is to be switched high-to-low. The NMOS pull-down transistor MN1 may comprise a plurality of parallel-connected NMOS transistors that are responsive to respective bits of a multi-bit pull-down control signal. This multi-bit pull-down control signal, which is an active high signal, is shown as PD_CODE. The plurality of parallel-connected NMOS transistors may represent an array of binary weighted transistors that are selectively enabled to match impedance characteristics of the load. The value of the pull-down control signal PD_CODE may be updated periodically to maintain the impedance matching characteristics of the driver circuit 10.

As will be understood by those skilled in the art, the pass transistors MP0 and MN0 will go into saturation before the output terminal OUT switches through ½VDDQ, when VDDQ, which is the power supply voltage, is reduced. As illustrated by the I-V curve of FIG. 2, when the output terminal OUT of the driver circuit 10 of FIG. 1 is swept from GND to VDDQ, a highly nonlinear I-V characteristic is observed after the voltage of the output terminal ($V_{OUT}$) exceeds about ½VDDQ, where VDDQ=1.5 Volts. Furthermore, the speed of the driver circuit 10 may be limited by the fact that both the pull-up and pull-down paths include a serial connection of two transistors, which means that relatively large transistors are required to maintain sufficiently high switching speed.

FIG. 3 illustrates another conventional driver circuit 12 that includes two parallel pull-up paths and two parallel pull-down paths. The pull-up paths include the series combination of PMOS transistors MP0 and MP1 in parallel with PMOS transistor MP2. The pull-down paths include the series combination of NMOS transistors MN0 and MN1 in parallel with NMOS transistor MN2. The PMOS transistor MP0 and the NMOS transistor MN0 are configured as MOS diodes, which operate to improve the linearity of the driver circuit 12. However, because two of the transistor gates are connected to the output terminal OUT, the driver circuit 12 of FIG. 3 may have relatively poor electrostatic discharge (ESD) characteristics and relatively high output capacitance. The ESD characteristics of the driver circuit 12 may be improved by adding resistors at the gate terminal of PMOS transistor MP0 and gate terminal of NMOS transistor MN0, however this will result in an RC delay that may limit voltage tracking between the gate terminals of the transistors MP0 and MN0 and the output terminal OUT.

Thus, notwithstanding these conventional output driver circuits, there continues to be a need for driver circuits having highly linear I-V characteristics at low power supply voltages.

SUMMARY OF THE INVENTION

Impedance-matched output driver circuits according to embodiments of the present invention have highly linear drive characteristics over a range of different test and process conditions. These linear drive characteristics, which may be coarsely and finely tuned during operation, are also impedance-matched to off-chip loads that are connected to outputs of the driver circuits. In some embodiments of the present invention, the output driver circuits include a first totem pole driver stage and a second totem pole driver stage. The first totem pole driver stage includes at least one PMOS pull-up transistor and at least one NMOS pull-down transistor therein that are responsive to a first pull-up signal and a first pull-down signal, respectively. The second totem pole driver stage has at least one NMOS pull-up transistor and at least one PMOS pull-down transistor therein that are responsive to a second pull-up signal and second pull-down signal, respectively. The linearity of the output driver circuit is enhanced by including a first resistive element that extends between the first and second totem pole driver stages. In particular, the first resistive element has a first terminal, which is electrically coupled to drain terminals of the at least one PMOS pull-up transistor and the at least one NMOS pull-down transistor in the first totem pole driver stage, and a second terminal, which is electrically coupled to source terminals of the at least one NMOS pull-up transistor and the at least one PMOS pull-down transistor in the second totem pole driver stage.

According to preferred aspects of these embodiments, the at least one PMOS pull-up transistor includes a coarsely tuned array of binary weighted PMOS pull-up transistors in parallel with a finely tuned array of non-binary weighted PMOS pull-up transistors. Similarly, the at least one NMOS pull-down transistor includes a coarsely tuned array of binary weighted NMOS pull-down transistors in parallel with a finely tuned array of non-binary weighted NMOS pull-down transistors. Moreover, the at least one NMOS pull-up transistor includes a coarsely tuned array of binary weighted NMOS pull-up transistors in parallel with a finely tuned array of non-binary weighted NMOS pull-up transistors. Likewise, the at least one PMOS pull-down transistor includes a coarsely tuned array of binary weighted PMOS pull-down transistors in parallel with a finely tuned array of non-binary weighted PMOS pull-down transistors. The second totem pole driver stage may further include a normally-on PMOS pull-up transistor, which has a drain terminal electrically connected to a drain terminal of the at least one NMOS pull-up transistor and a source terminal that is electrically coupled to a power supply line. The second totem pole driver stage may also include a normally-on NMOS pull-down transistor, which has a drain terminal electrically connected to a drain terminal of the at least one PMOS pull-down transistor and a source terminal that is electrically coupled to reference supply line.

In other embodiments of the present invention, an output driver circuit is provided having a totem pole driver stage therein. The totem pole driver stage includes a PMOS pull-up path and an NMOS pull-down path therein, which are electrically connected in series between a power supply line and a reference supply line. According to preferred aspects of these embodiments, the PMOS pull-up path includes at least one PMOS pass transistor having a drain terminal that is electrically coupled to an output terminal of the output driver circuit and a gate terminal that is responsive to a first pull-up control signal. An array of PMOS pull-up transistors are also provided within the pull-up path. The PMOS pull-up transistors within the array have drain terminals that are electrically coupled to a source terminal of the at least one PMOS pass transistor and gate terminals that are responsive to course and fine pull-up enable signals. In particular, the array of PMOS pull-up transistors includes a coarsely tuned array of binary weighted PMOS pull-up transistors in parallel with a finely tuned array of non-binary weighted PMOS pull-up transistors.

Similarly, the NMOS pull-down path includes at least one NMOS pass transistor having a drain terminal that is electrically coupled to the output terminal of the output driver circuit and a gate terminal that is responsive to a first pull-down control signal. The pull-down path also includes an array of NMOS pull-down transistors. The NMOS pull-down transistors within the array have drain terminals that are electrically coupled to a source terminal of the at least one NMOS pass transistor and gate terminals that are responsive to course and fine pull-down enable signals. In particular, the array of NMOS pull-down transistors includes a coarsely tuned array of binary weighted NMOS pull-down transistors in parallel with a finely tuned array of non-binary weighted NMOS pull-down transistors. Moreover, the at least one PMOS pass transistor may include first and second PMOS pass transistors that are responsive to first and second pull-up control signals, respectively. In this case, the second PMOS pass transistor is about twice as wide as the first PMOS pass transistor, which enables the second PMOS pass transistor to turn on shortly after the first PMOS pass transistor turns on. Similarly, the at least one NMOS pass transistor may include first and second NMOS pass transistors that are responsive to first and second pull-down control signals, respectively.

DETAILED DESCRIPTION OF PREFERRED EMBODIMENTS

Figure 1:
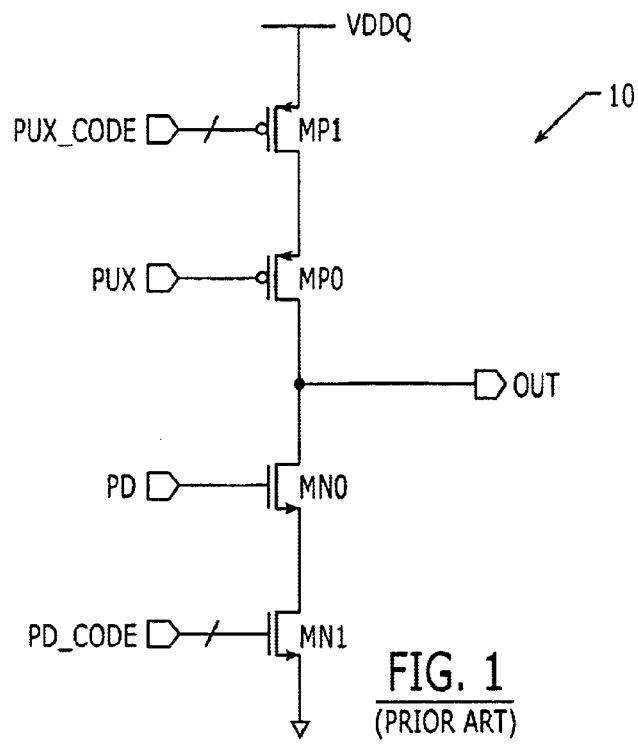
FIG. 1 is an electrical schematic of a conventional impedance-matched output driver circuit having a totem pole arrangement of PMOS pull-up transistors and NMOS pull-down transistors therein.
Figure 2:
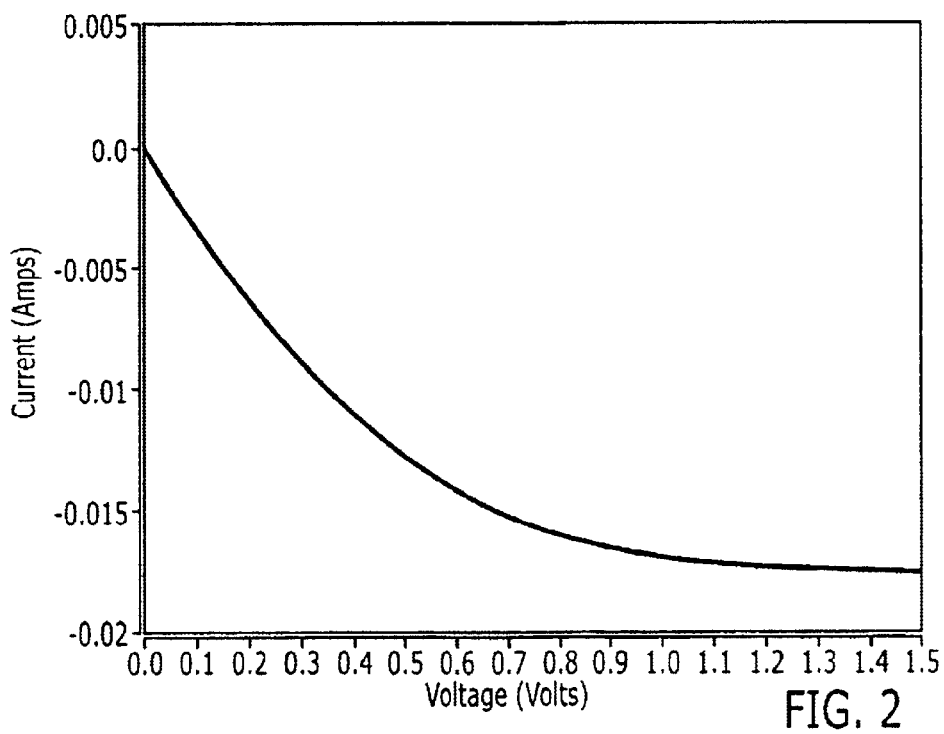
FIG. 2 is an I-V curve that illustrates the pull-down characteristics of the driver circuit of FIG. 1.
Figure 3:
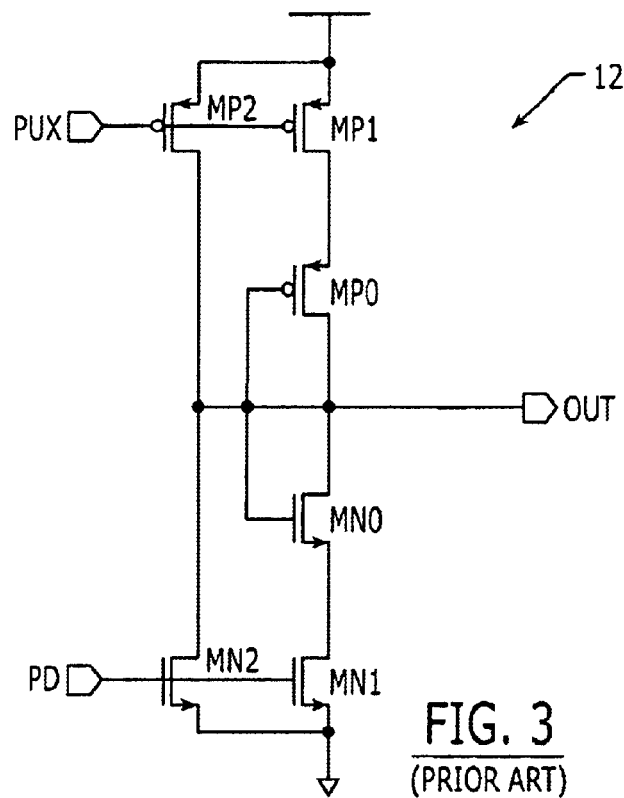
FIG. 3 is an electrical schematic of a conventional impedance-matched output driver circuit having MOS diodes therein that compensate for non-linear MOS characteristics.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix "X" (or prefix symbol "/") to a signal name may also denote a complementary data or information signal or an active low control signal, for example.

Figure 4:
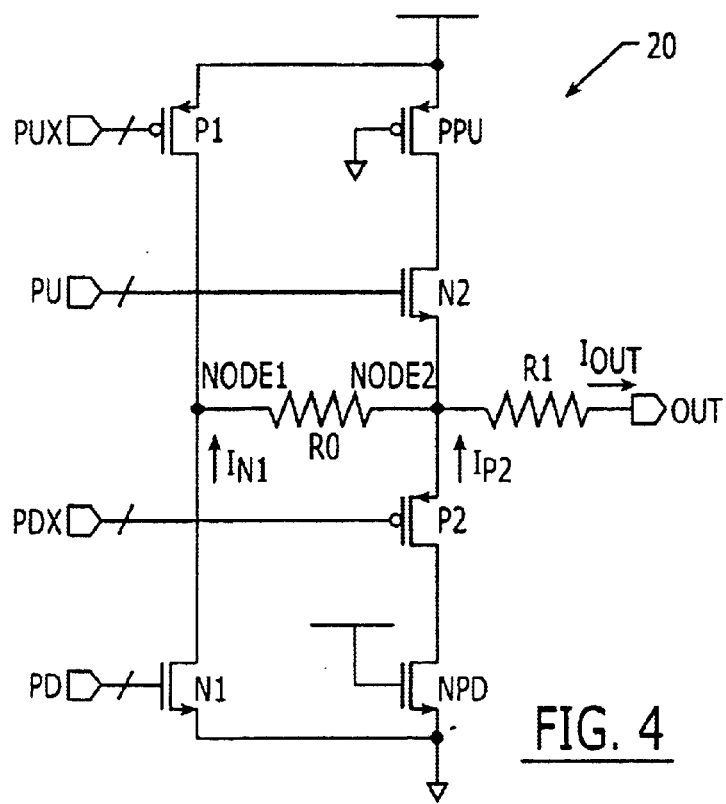
FIG. 4 is an electrical schematic of an impedance-matched output driver circuit according to an embodiment of the present invention.

Referring now to FIG. 4, an impedance-matched output driver circuit 20 according to an embodiment of the present invention will be described. The driver circuit 20 includes a first totem pole driver stage having at least one PMOS pull-up transistor P1 and at least one NMOS pull-down transistor N1 therein. The at least one. PMOS pull-up transistor P1 is responsive to a first pull-up signal, shown as PUX, and the at least one NMOS pull-down transistor N1 is responsive to a first pull-down signal, shown as PD. The first pull-up signal PUX is an active low signal and the first pull-down signal PD is an active high signal. A second totem pole driver stage is also provided. The second totem pole driver stage has at least one NMOS pull-up transistor N2 and at least one PMOS pull-down transistor P2 therein. The at least one NMOS pull-up transistor N2 is responsive to a second pull-up signal PU and the at least one PMOS pull-down transistor P2 is responsive to a second pull-down signal PDX. The second pull-up signal PU is an active high signal and the second pull-down signal PDX is an active low signal (where/PU=PUX and/PD=PDX). The second totem pole driver stage may also include a normally-on PMOS pull-up transistor PPU in a pull-up path and a normally-on NMOS pull-down transistor NPD in a pull-down path. These normally-on transistors, which are optional, provide improved ESD performance.

The resistor R1, which is electrically connected between an output node of the second totem pole driver stage (shown as NODE2) and an output terminal OUT of the driver circuit 20, is an optional resistor that provides improved ESD performance. The resistor R0, which is connected between an output node NODE1 of the first totem pole driver stage and the output node NODE2, is provided to improve the linearity of the driver circuit 20, as explained more fully hereinbelow. The resistance of resistor R1 is typically smaller than the resistance of R0, however, in some cases the reverse may be true.

Figure 5:
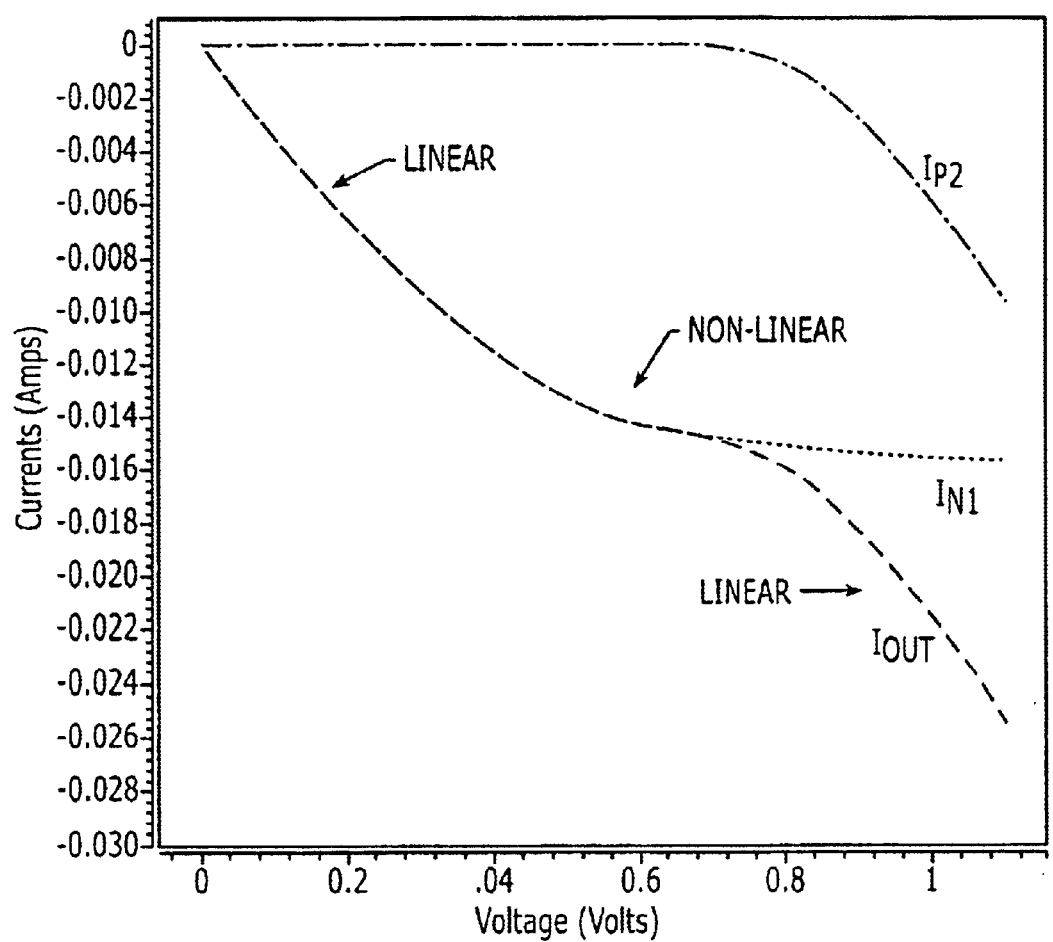
FIG. 5 is an I-V curve that illustrates the pull-down characteristics of the driver circuit of FIG. 4, without resistor R0 (i.e., R0=0 ohms).
Figure 6:
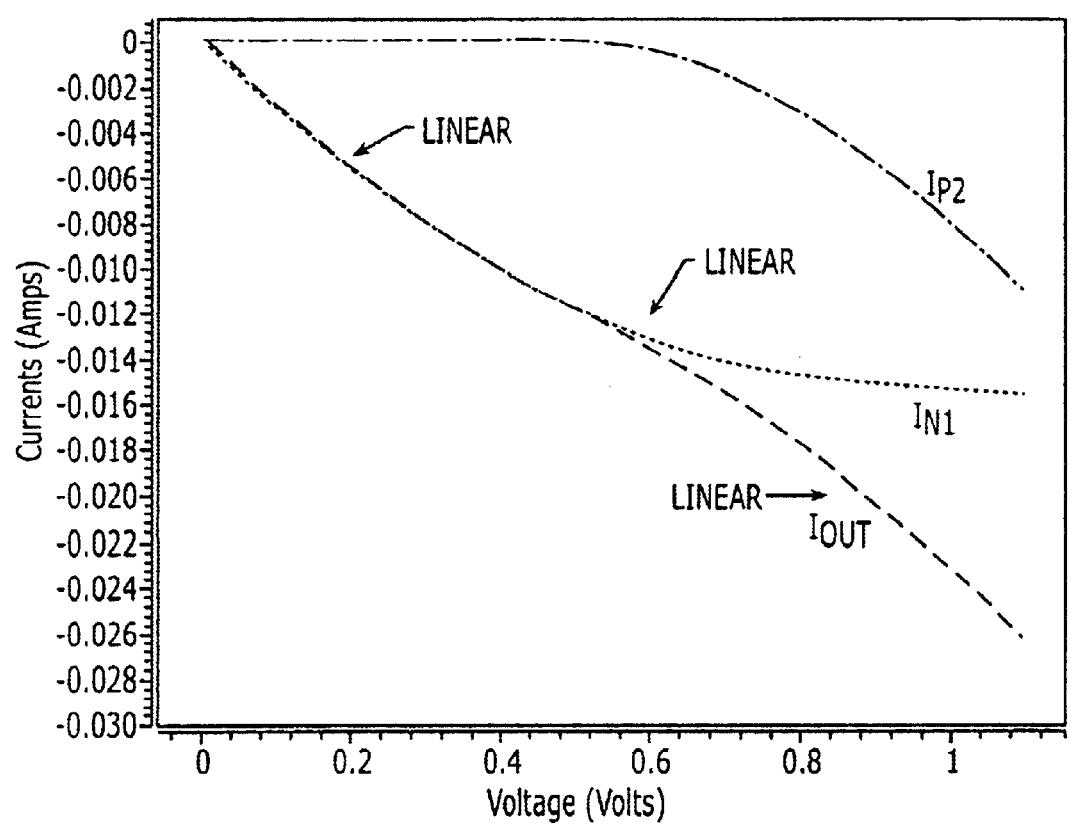
FIG. 6 is an I-V curve that illustrates the pull-down characteristics of the driver circuit of FIG. 4, with R0=10 ohms.

Operation of the output driver circuit 20 of FIG. 4 will now be described more fully with reference to FIGS. 5–6. In particular, FIG. 5 is an I-V curve that illustrates the pull-down characteristics of the driver circuit 20 of FIG. 4 without resistor R0 (i.e., R0=0 ohms) and with R1=0, and FIG. 6 is an I-V curve that illustrates the pull-down characteristics of the driver circuit 20 of FIG. 4, with R0=10 ohms and R1=5. FIG. 5 illustrates three I-V curves: $I_{P2}$, $I_{N1}$ and $I_{OUT}$ (where $I_{OUT}=I_{P2}+I_{N1}$) The I-V curve $I_{P2}$ represents current through the at least one PMOS pull-down transistor P2 when the output terminal is swept low-to-high from the ground reference voltage (GND) to the power supply voltage (VDDQ) (with PU=0, PUX=1, PD=1 and PDX=0). Similarly, the I-V curve $I_{N1}$ represents current through the at least one NMOS pull-down transistor N1 when the output terminal is swept low-to-high from the ground reference voltage (GND) to the power supply voltage (VDDQ). As illustrated by FIG. 5, when the voltage at NODE2 is less than Vtp (where Vtp is the threshold voltage of PMOS pull-down transistor P2) and the voltage of NODE1 is less than VDDQ-Vtn (where Vtn is the threshold voltage of NMOS pull-down transistor N1), then the NMOS pull-down transistor N1 is in its linear region of operation and PMOS pull-down transistor P2 is off. Accordingly, the I-V curve $I_{OUT}$ has a linear characteristic when the voltage at the output terminal OUT (i.e., $V_{OUT}$) is small. However, as the voltage at the output terminal OUT increases, the voltages at the nodes NODE1 and NODE2 increase. When the voltage at NODE1 becomes greater than VDDQ-Vtn, the NMOS pull-down transistor N1 enters saturation and the curve $I_{N1}$ shows non-linear characteristics. When the voltage at NODE2 exceeds Vtp, the PMOS pull-down transistor P2 begins to turn on and the current $I_{P2}$ flowing through PMOS pull-down transistor P2 can compensate for the non-linearity of $I_{N1}$. However, if process and temperature conditions cause Vtn and Vtp to increase, then the curve $I_{N1}$ will shift left and the curve $I_{P2}$ will shift right. This will cause the I-V curve $I_{OUT}$ to have a relatively wide middle portion that is non-linear, as illustrated by FIG. 5.

The I-V curve $I_{OUT}$ of FIG. 5 can be improved by having the PMOS pull-down transistor P2 of FIG. 4 turn on earlier (before the NMOS pull-down transistor N1 enters saturation) when the output terminal OUT is swept low-to-high. This will have the effect of moving the curve $I_{P2}$ to the left. Adding the resistor R0 between NODE1 and NODE2 will have the effect of making the voltage at NODE1 lower than the voltage at NODE2 when the output terminal is swept low-to-high. This, in turn, will cause the NMOS pull-down transistor N1 to enter saturation at a higher output voltage ($V_{OUT}$) and result in a shift to the right of curve $I_{N1}$, as illustrated by FIG. 6. By setting the value of the resistor R0 to a level sufficient to delay the onset of saturation in NMOS pull-down transistor N1 until the PMOS pull-down transistor P2 has turned on, the linearity of the I-V curve $I_{OUT}$ can be significantly improved.

Figure 7:
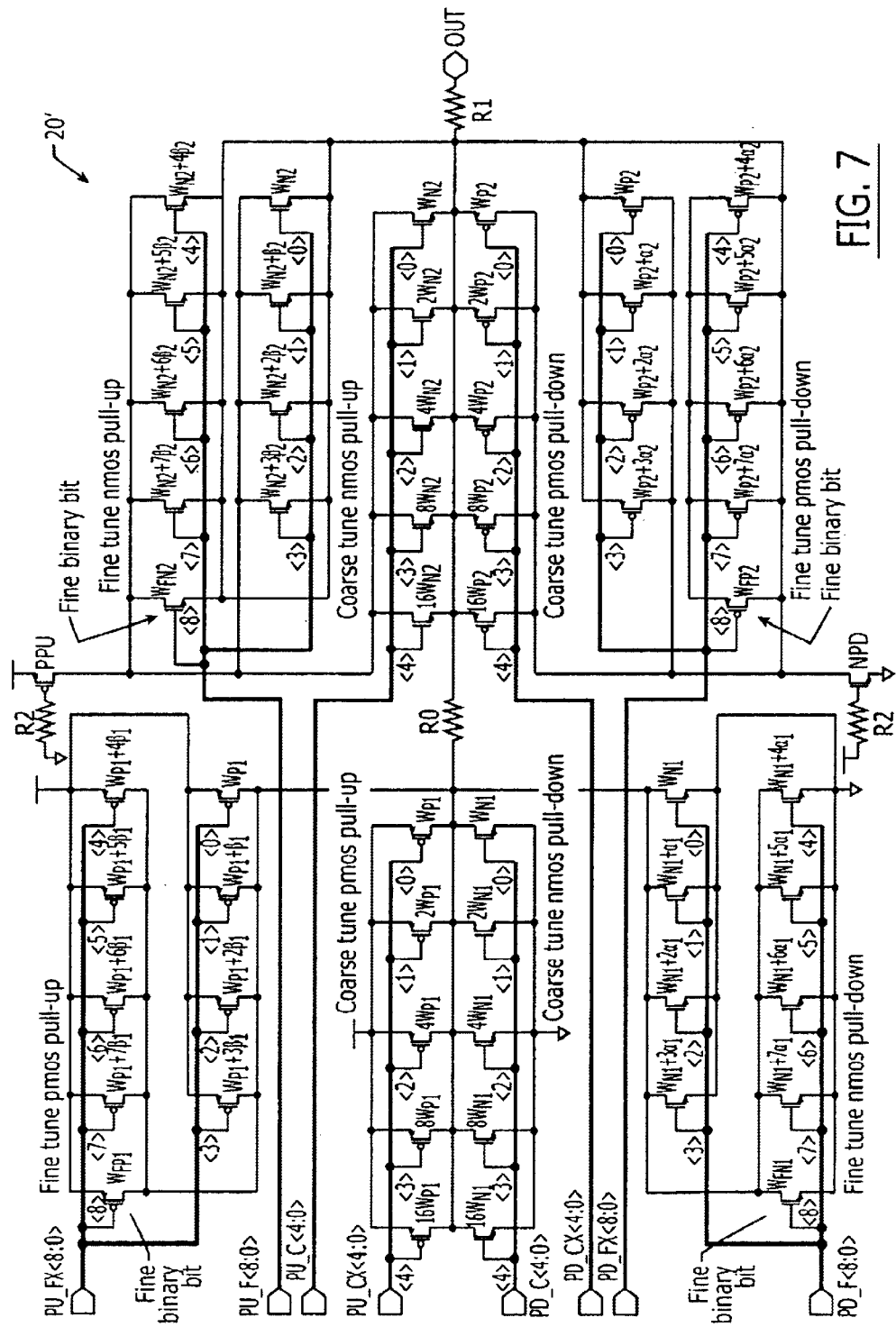
FIG. 7 is an electrical schematic of an impedance-matched output driver circuit according to another embodiment of the present invention.

Referring now to FIG. 7, an impedance-matched output driver circuit 20' according to another embodiment of the present invention will be described. The driver circuit 20' of FIG. 7 is similar to the driver circuit 20 of FIG. 4, however, each one of the PMOS transistors P1 and P2 in FIG. 4 has been replaced by two (2) arrays of PMOS transistors and each one of the NMOS transistors N1 and N2 in FIG. 4 has been replaced by two (2) arrays of NMOS transistors. These arrays of transistors enable the output driver circuit 20' to be accurately matched to an impedance of an off-chip load that is being driven by the output terminal OUT.

In particular, the PMOS pull-up transistor P1 in FIG. 4 can be replaced by a coarsely-tuned array of binary weighted PMOS pull-up transistors and a finely-tuned array of non-binary weighted PMOS pull-up transistors. The coarsely-tuned array of binary weighted PMOS pull-up transistors is illustrated in FIG. 7 as including five (5) PMOS transistors having widths equal to: $W_{P1}$, 2 $W_{P1}$, 4 $W_{P1}$, 8 $W_{P1}$ and 16 $W_{P1}$, as illustrated. These five PMOS transistors are responsive to respective bits of a coarse PMOS pull-up control signal PU_CX<4:0>, with one or more of the coarse bits being set to an active low level. Thus, the coarse PMOS pull-up control signal PU_CX<4:0> may have $2^5=32$ possible values. The finely-tuned array of non-binary weighted PMOS pull-up transistors is illustrated in FIG. 7 as including nine (9) PMOS transistors having widths equal to: $W_{P1}$, $W_{P1}+\beta_1$, $W_{P1}+2\beta_1$, $W_{P1}+3\beta_1$, $W_{P1}+4\beta_1$, $W_{P1}+5\beta_1$, $W_{P1}+6\beta_1$, $W_{P1}+7\beta_1$ and $W_{FP1}$. In some cases, the PMOS transistor having a width equal to $W_{FP1}$ is optional and represents one bit of fine tuning where $W_{FP1} \ne W_{P1}+n\beta_1$ (where n is a non-negative integer). These nine PMOS transistors are responsive to respective bits of a fine PMOS pull-up control signal PU_FX<8:0>. The fine PMOS pull-up control signal PU FX<8:0> may be set so that only one of the bits PU_FX<7:0> is set to an active low level. The single bit PU_FX<8> may also be set high or low depending on whether one additional bit of fine control is necessary. Thus, the fine PMOS pull-up control signal PU_FX<8:0> may have 16 possible values.

Similarly, the NMOS pull-up transistor N2 in FIG. 4 can be replaced by a coarsely-tuned array of binary weighted NMOS pull-up transistors and a finely-tuned array of non-binary weighted NMOS pull-up transistors. The coarsely-tuned array of binary weighted NMOS pull-up transistors is illustrated in FIG. 7 as including five (5) NMOS transistors having widths equal to: $W_{N2}$, 2 $W_{N2}$, 4 $W_{N2}$, 8 $W_{N2}$ and 16 $W_{N2}$, as illustrated. These five NMOS transistors are responsive to respective bits of a coarse NMOS pull-up control signal PU_C<4:0>, with one or more of the coarse bits being set to an active high level. Thus, the coarse NMOS pull-up control signal PU_C<4:0> may have $2^5=32$ possible values. The finely-tuned array of non-binary weighted NMOS pull-up transistors is illustrated in FIG. 7 as including nine (9) NMOS transistors having widths equal to: $W_{N2}$, $W_{N2}+\beta_2$, $W_{N2}+2\beta_2$, $W_{N2}+3\beta_2$, $W_{N2}+4\beta_3$, $W_{N2}+5\beta_2$, $W_{N2}+6\beta_2$, $W_{N2}+7\beta_2$ and $W_{FN2}$. In some cases, the NMOS transistor having a width equal to $W_{FN2}$ is optional and represents one bit of fine tuning where $W_{FN2} \ne W_{N2}+n\beta_2$ (where n is a non-negative integer). These nine NMOS transistors are responsive to respective bits of a fine NMOS pull-up control signal PU_F<8:0>. The fine NMOS pull-up control signal PU_F<8:0> may be set so that only one of the bits PU_F<7:0> is set to an active high level. The single bit PU_F<8> may also be set high or low depending on whether one additional bit of fine control is necessary. Thus, the fine NMOS pull-up control signal PU_F<8:0> may have 16 possible values.

As further illustrated by FIG. 7, the NMOS pull-down transistor N1 in FIG. 4 can be replaced by a coarsely-tuned array of binary weighted NMOS pull-down transistors and a finely-tuned array of non-binary weighted NMOS pull-down transistors. The coarsely-tuned array of binary weighted NMOS pull-down transistors is illustrated as including five (5) NMOS transistors having widths equal to: $W_{N1}$, $2 W_{N1}$, $4 W_{N1}$, $8 W_{N1}$ and $16 W_{N1}$, as illustrated. These five NMOS transistors are responsive to respective bits of a coarse NMOS pull-down control signal PD_C<4:0>, with one or more of the coarse bits being set to an active high level. Thus, the coarse NMOS pull-down control signal PD_C<4:0> may have $2^5$=32 possible values. The finely-tuned array of non-binary weighted NMOS pull-down transistors is illustrated in FIG. 7 as including nine (9) NMOS transistors having widths equal to: $W_{N1}$, $W_{N1}+\alpha_1$, $W_{N1}+2\alpha_1$, $W_{N1}+3\alpha_1$, $W_{N1}+4\alpha_1$, $W_{N1}+5\alpha_1$, $W_{N1}+6\alpha_1$, $W_{N1}+7\alpha_1$ and $W_{FN1}$. In some cases, the NMOS transistor having a width equal to $W_{FN1}$ is optional and represents one bit of fine tuning where $W_{FN1} \neq W_{N1}+n\alpha_1$ (where n is a non-negative integer). These nine NMOS transistors are responsive to respective bits of a fine NMOS pull-down control signal PD_F<8:0>. The fine NMOS pull-down control signal PD_F<8:0> may be set so that only one of the bits PD_F<7:0> is set to an active high level. The single bit PD_F<8> may also be set high or low depending on whether one additional bit of fine control is necessary. Thus, the fine NMOS pull-down control signal PD_F<8:0> may have 16 possible values.

Finally, the PMOS pull-down transistor P2 in FIG. 4 can be replaced by a coarsely-tuned array of binary weighted PMOS pull-down transistors and a finely-tuned array of non-binary weighted PMOS pull-down transistors. The coarsely-tuned array of binary weighted PMOS pull-down transistors is illustrated as including five (5) PMOS transistors having widths equal to: $W_{P2}$, $2 W_{P2}$, $4 W_{P2}$, $8 W_{P2}$ and $16 W_{P2}$, as illustrated. These five PMOS transistors are responsive to respective bits of a coarse PMOS pull-down control signal PD_CX<4:0>, with one or more of the coarse bits being set to an active low level. Thus, the coarse PMOS pull-down control signal PD_CX<4:0> may have $2^5$=32 possible values. The finely-tuned array of non-binary weighted PMOS pull-down transistors is illustrated in FIG. 7 as including nine (9) PMOS transistors having widths equal to: $W_{P2}$, $W_{P2}+\alpha_2$, $W_{P2}+2\alpha_2$, $W_{P2}+3\alpha_2$, $W_{P2}+4\alpha_1$, $W_{P2}+5\alpha_2$, $W_{P2}+6\alpha_2$, $W_{P2}+7\alpha_2$ and $W_{FP2}$. In some cases, the NMOS transistor having a width equal to $W_{FP2}$ is optional and represents one bit of fine tuning where $W_{FP2} \neq W_{P2}+n\alpha_2$ (where n is a non-negative integer). These nine PMOS transistors are responsive to respective bits of a fine PMOS pull-down control signal PD_FX<8:0>. The fine PMOS pull-down control signal PD_FX<8:0> may be set so that only one of the bits PD_FX<7:0> is set to an active low level. The single bit PD_FX<8> may also be set high or low depending on whether one additional bit of fine control is necessary. Thus, the fine PMOS pull-down control signal PD_FX<8:0> may have 16 possible values.

Figure 9:
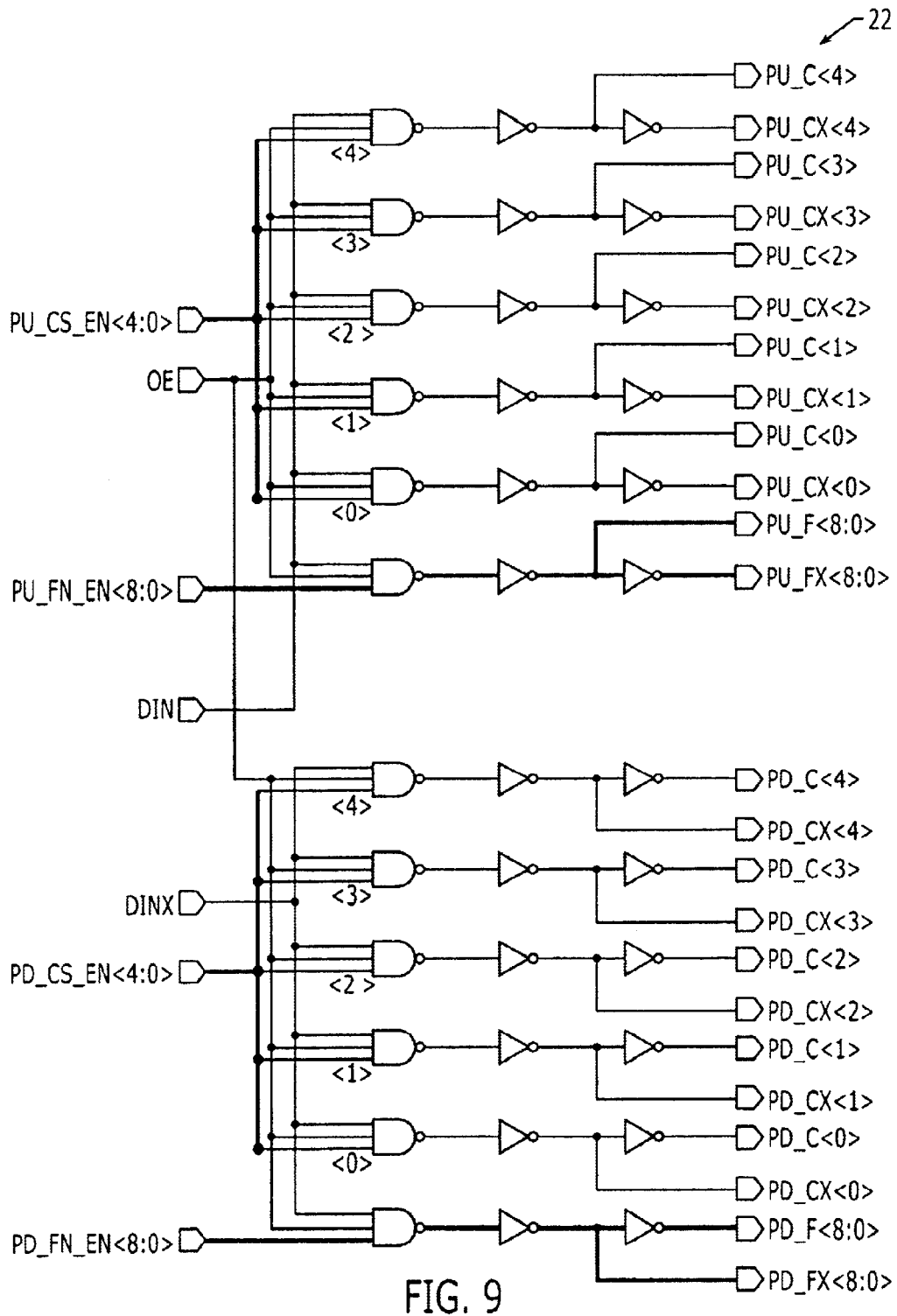
FIG. 9 is an electrical schematic of a pre-driver circuit that is configured to generate the control signals received by the driver circuit of FIG. 7.

The multi-bit pull-up and pull-down control signals illustrated by FIG. 7 are generated by a pre-driver circuit that is responsive to pull-up and pull-down enable signals (coarse and fine), a pair of complementary data signals (DIN and DINX) and an active high output enable signal (OE). An exemplary pre-driver circuit 22 is illustrated by FIG. 9. This pre-driver circuit 22 is responsive to various enable signals. These enable signals include a coarse pull-up enable signal PU_CS_EN<4:0>, a fine pull-up enable signal PU_FN_EN<8:0>, a coarse pull-down enable signal PD_CS_EN<4:0> and a fine pull-down enable signal PD_FN_EN<8:0>. These enable signals have active high levels that identify which ones of the pull-up and pull-down transistors within FIG. 7 are active during a switching time interval. These enable signals may be signals that are latched by latching circuitry (not shown) and periodically updated to provide accurate impedance matching characteristics to the output driver circuit 20'. As will be understood by those skilled in the art, an impedance matching circuit having coarse and fine PMOS and NMOS arrays similar to those illustrated by FIG. 7 may be used to generate impedance matching signals that are provided to the latching circuitry. This impedance matching circuit may also utilize a high precision off-chip resistor(s) to facilitate tuning of the impedance matching signals. In particular, an impedance matching circuit, which correspond to a portion of the driver circuit 20' of FIG. 7, may include: a resistor R0, the coarsely-tuned array of binary weighted PMOS pull-up transistors, the finely-tuned array of non-binary weighted PMOS pull-up transistors, the coarsely-tuned array of binary weighted NMOS pull-up transistors and the finely-tuned array of non-binary weighted NMOS pull-up transistors, as illustrated by the pull-up transistors in FIG. 7. The impedance matching circuit may also include: a resistor R0, the coarsely-tuned array of binary weighted NMOS pull-down transistors, the finely-tuned array of non-binary weighted NMOS pull-down transistors, the coarsely-tuned array of binary weighted PMOS pull-down transistors and the finely-tuned array of non-binary weighted PMOS pull-down transistors, as illustrated by the pull-down transistors in FIG. 7. As will be understood by those skilled in the art, the pull-up impedance defined by the pull-up transistors is initially matched to a high precision off-chip resistor and then the pull-down impedance defined by the pull-down transistors is matched to the pull-up impedance, or vice versa.

When the output enable signal is inactive (i.e., OE=0), all of the coarse and fine pull-up and pull-down control signals generated by the pre-driver circuit 22 of FIG. 9 will be inactive and the output terminal OUT of the output driver 20' of FIG. 7 will be disposed in a high impedance state. However, when the output enable signal is active (i.e., OE=1) and the true data signal (DIN) is switched low-to-high, respective ones of the coarse pull-up control signals PU_C<4:0> and PU_CX<4:0> and fine pull-up control signals PU_F<8:0> and PU_FX<8:0> will become active to pull the output terminal OUT low-to-high. Similarly, when the output enable signal is active (i.e., OE=1) and the true data signal (DIN) is switched high-to-low, respective ones of the coarse pull-down control signals PD_C<4:0> and PD_CX<4:0> and fine pull-down control signals PD_F<8:0> and PD_FX<8:0> will become active to pull the output terminal OUT high-to-low.

Figure 8:
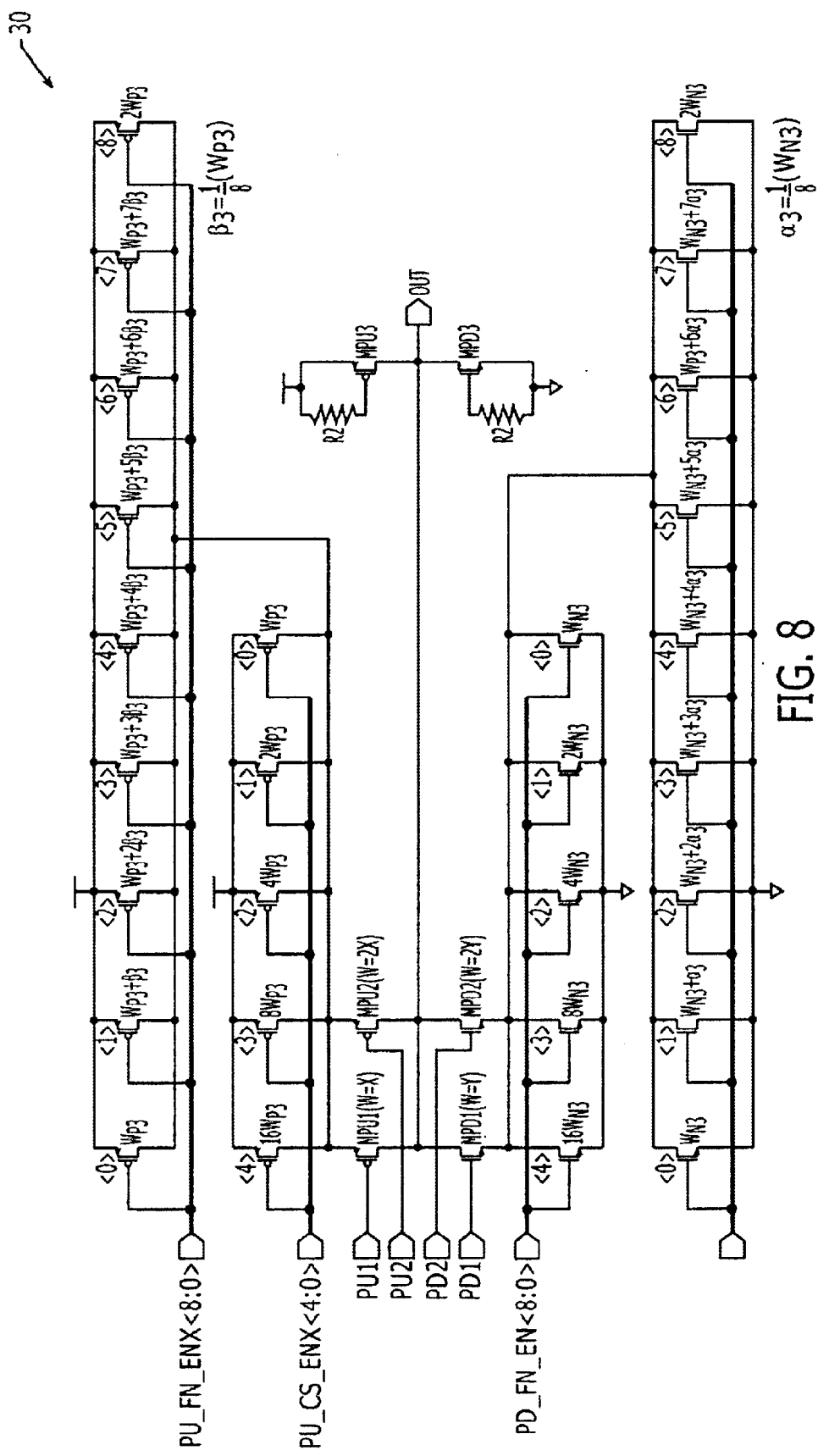
FIG. 8 is an electrical schematic of an impedance-matched output driver circuit according to a further embodiment of the present invention.

Referring now to FIG. 8, an impedance-matched output driver circuit 30 according to another embodiment of the present invention includes a totem pole driver stage having a PMOS pull-up path and an NMOS pull-down path therein that are electrically connected in series between a power supply line (VDDQ) and a ground reference line (GND). The PMOS pull-up path includes a first PMOS pass transistor MPU1 and a second PMOS pass transistor MPU2, connected as illustrated. The second PMOS pass transistor MPU2 may be twice as wide as the first PMOS pass transistor, which has a width W=X (e.g., X=400 microns). The first and second PMOS pass transistors MPU1 and MPU2 may be responsive to respective pull-up control signals PU1 and PU2, respectively. These pull-up control signals PU1 and PU2 may be switched high-to-low when the output terminal OUT is to be switched low-to-high. A normally-off PMOS pull-up transistor MPU3 and normally-off NMOS pull-down transistor MPD3 may be provided to increase ESD resistance at the output terminal OUT. The value of the resistor R2 may be about 1K ohms in some embodiments. The NMOS pull-down path includes a first NMOS pass transistor MPD1 and a second NMOS pass transistor MPD2, connected as illustrated. The second NMOS pass transistor MPD2 may be twice as wide as the first NMOS pass transistor, which has a width W=Y (e.g., Y=200 microns). The first and second NMOS pass transistors MPD1 and MPD2 may be responsive to respective pull-down control signals PD1 and PD2, respectively. These pull-down control signals PD1 and PDU2 may be switched low-to-high when the output terminal OUT is to be switched high-to-low.

The pull-up path also includes an array of PMOS pull-up transistors having drain terminals that are electrically coupled to source terminals of the PMOS pass transistors MPU1 and MPU2 and gate terminals that are responsive to course and fine pull-up enable signals, shown as PU_CS_ENX<4:0> and PU_FN_ENX<8:0>. In particular, the PMOS pull-up transistors include a coarsely tuned array of binary weighted PMOS pull-up transistors in parallel with a finely tuned array of non-binary weighted PMOS pull-up transistors. The PMOS pull-up transistors in the coarsely tuned array have widths equal to: $W_{P3}$, $2\,W_{P3}$, $4\,W_{P3}$, $8\,W_{P3}$ and $16\,W_{P3}$ and the PMOS pull-up transistors in the finely tuned array have widths equal to: $W_{P3}$, $W_{P3}+\beta_3$, $W_{P3}+2\beta_3$, $W_{P3}+3\beta_3$, $W_{P3}+4\beta_3$, $W_{P3}+5\beta_3$, $W_{P3}+6\beta_3$, $W_{P3}+7\beta_3$ and $2\,W_{P3}$ (where $\beta_3=\frac{1}{8}W_{P3}$).

The five PMOS pull-up transistors in the coarsely tuned array are responsive to respective bits of the coarse pull-up enable signal PU_CS_ENX<4:0>, with one or more of the coarse bits being set to an active low level. Thus, the coarse pull-up enable signal PU CS_ENX<4:0> may have $2^5=32$ possible values. The nine PMOS pull-up transistors in the finely-tuned array are responsive to respective bits of a fine pull-up enable signal PU_FN_ENX<8:0>, with only one of the bits being set to an active low level. Thus, the fine pull-up enable signal PU_FN_ENX<8:0> may have nine possible values.

Similarly, the pull-down path includes an array of NMOS pull-down transistors having drain terminals that are electrically coupled to source terminals of the NMOS pass transistors MPD1 and MPD2 and gate terminals that are responsive to course and fine pull-down enable signals, shown as PD_CS EN<4:0> and PD_FN_EN<8:0>. In particular, the NMOS pull-down transistors include a coarsely tuned array of binary weighted NMOS pull-down transistors in parallel with a finely tuned array of non-binary weighted NMOS pull-down transistors. The NMOS pull-down transistors in the coarsely tuned array have widths equal to: $W_{N3}$, $2\,W_{N3}$, $4\,W_{N3}$, $8\,W_{N3}$ and $16\,W_{N3}$ and the NMOS pull-down transistors in the finely tuned array have widths equal to: $W_{N3}$, $W_{N3}+\alpha_3$, $W_{N3}+2\alpha_3$, $W_{N3}+3\alpha_3$, $W_{N3}+4\alpha_3$, $W_{N3}+5\alpha_3$, $W_{N3}+6\alpha_3$, $W_{N3}+7\alpha_3$ and $2\,W_{N3}$ (where $\alpha_3=\frac{1}{8}W_{N3}$).

The five NMOS pull-down transistors in the coarsely tuned array are responsive to respective bits of the coarse pull-down enable signal PD_CS_EN<4:0>, with one or more of the coarse bits being set to an active high level. Thus, the coarse pull-down enable signal PDU_CS_EN<4:0> may have $2^5=32$ possible values. The nine NMOS pull-down transistors in the finely-tuned array are responsive to respective bits of a fine pull-down enable signal PD_FN_EN<8:0>, with only one of the bits being set to an active high level. Thus, the fine pull-down enable signal PD_FN_EN<8:0> may have nine possible values.

As will be understood by those skilled in the art, an impedance matching circuit having coarse and fine PMOS and NMOS arrays similar to those illustrated by FIG. 8 may be used to generate impedance matching signals. This impedance matching circuit may also utilize a high precision off-chip resistor(s) to facilitate tuning of the impedance matching signals. In particular, an impedance matching circuit, which corresponds to a portion of the driver circuit 30 of FIG. 8, may include a PMOS pass transistor, the coarsely-tuned array of binary weighted PMOS pull-up transistors ($W_{P3}$, $2\,W_{P3}$, ..., $16\,W_{P3}$) and the finely-tuned array of non-binary weighted PMOS pull-up transistors ($W_{P3}$, $W_{P3}+\beta_3$, ..., $2\,W_{P3}$). With respect to the pull-down paths, the impedance matching circuit may also include an NMOS pass transistor, the coarsely-tuned array of binary weighted NMOS pull-down transistors ($W_{N3}$, $2\,W_{N3}$, ..., $16\,W_{N3}$) and the finely-tuned array of non-binary weighted NMOS pull-down transistors ($W_{N3}$, $W_{N3}+\alpha_3$, ..., $2\,W_{N3}$). Programming operations may be performed to match a pull-up impedance defined by the PMOS pass and pull-up transistors to a high precision off-chip resistor and then match a pull-down impedance defined by the NMOS pass and pull-down transistors to the pull-up impedance, or vice versa.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An output driver circuit, comprising:
   a first totem pole driver stage having at least one PMOS pull-up transistor and at least one NMOS pull-down transistor therein that are responsive to a first pull-up signal and a first pull-down signal, respectively;
   a second totem pole driver stage having at least one NMOS pull-up transistor and at least one PMOS pull-down transistor therein that are responsive to a second pull-up signal and second pull-down signal, respectively; and
   a first resistive element having a first terminal that is electrically coupled to drain terminals of the at least one PMOS pull-up transistor and the at least one NMOS pull-down transistor and a second terminal that is electrically coupled to source terminals of the at least one NMOS pull-up transistor and the at least one PMOS pull-down transistor.

2. The driver circuit of claim 1, wherein the first and second pull-up signals are complementary signals; and wherein the first and second pull-down signals are complementary signals.

3. The driver circuit of claim 1, wherein the drain terminals of the at least one PMOS pull-up transistor and the at least one NMOS pull-down transistor are electrically connected together at a first output node.

4. The driver circuit of claim 3, wherein the source terminals of the at least one NMOS pull-up transistor and the at least one PMOS pull-down transistor are electrically connected together at a second output node.

5. The driver circuit of claim 4, further comprising a second resistive element that is electrically connected between an output terminal of the driver circuit and the second output node.

6. The driver circuit of claim 5, wherein a resistance of the second resistive element is less than a resistance of the first resistive element.

7. The driver circuit of claim 1, wherein said second totem pole driver stage comprises:

a normally-on PMOS pull-up transistor having a drain terminal electrically connected to a drain terminal of the at least one NMOS pull-up transistor; and a normally-on NMOS pull-down transistor having a drain terminal electrically connected to a drain terminal of the at least one PMOS pull-down transistor.

8. The driver circuit of claim 1, wherein said at least one PMOS pull-up transistor comprises:

a coarsely tuned array of binary weighted PMOS pull-up transistors in parallel with a finely tuned array of non-binary weighted PMOS pull-up transistors.

9. The driver circuit of claim 8, wherein said at least one NMOS pull-down transistor comprises:

a coarsely tuned array of binary weighted NMOS pull-down transistors in parallel with a finely tuned array of non-binary weighted NMOS pull-down transistors.

10. The driver circuit of claim 1, wherein said at least one NMOS pull-up transistor comprises:

a coarsely tuned array of binary weighted NMOS pull-up transistors in parallel with a finely tuned array of non-binary weighted NMOS pull-up transistors.

11. The driver circuit of claim 10, wherein said at least one PMOS pull-down transistor comprises:

a coarsely tuned array of binary weighted PMOS pull-down transistors in parallel with a finely tuned array of non-binary weighted PMOS pull-down transistors.

12. The driver circuit of claim 11, wherein said second totem pole driver stage comprises:

a normally-on PMOS pull-up transistor having a drain terminal electrically connected to a drain terminal of the at least one NMOS pull-up transistor; and a normally-on NMOS pull-down transistor having a drain terminal electrically connected to a drain terminal of the at least one PMOS pull-down transistor.

13. The driver circuit of claim 1, wherein said first resistive element has a resistance in a range from between about 5 ohms and about 15 ohms.

14. An output driver circuit, comprising:

a first totem pole driver stage having at least one PMOS pull-up transistor and at least one NMOS pull-down transistor therein that are responsive to a first pull-up signal and a first pull-down signal, respectively;

a second totem pole driver stage having at least one NMOS pull-up transistor and at least one PMOS pull-down transistor therein that are responsive to a second pull-up signal and second pull-down signal, respectively; and a first resistive element having a resistance value in a range from between about 0 ohms and about 20 ohms, said first resistive element having a first terminal that is electrically coupled to drain terminals of the at least one PMOS pull-up transistor and the at least one NMOS pull-down transistor and a second terminal that is electrically coupled to source terminals of the at least one NMOS pull-up transistor and the at least one PMOS pull-down transistor;

wherein said at least one PMOS pull-up transistor comprises:
a coarsely tuned array of binary weighted PMOS pull-up transistors in parallel with a finely tuned array of non-binary weighted PMOS pull-up transistors; and wherein said at least one NMOS pull-down transistor comprises:
a coarsely tuned array of binary weighted NMOS pull-down transistors in parallel with a finely tuned array of non-binary weighted NMOS pull-down transistors.

15. The driver circuit of claim 14, wherein said at least one NMOS pull-up transistor comprises a coarsely tuned array of binary weighted NMOS pull-up transistors in parallel with a finely tuned array of non-binary weighted NMOS pull-up transistors.

16. An output driver circuit, comprising:

a first totem pole driver stage having at least one PMOS pull-up transistor and at least one NMOS pull-down transistor therein that are responsive to a first pull-up signal and a first pull-down signal, respectively, said at least one PMOS pull-up transistor comprising a coarsely tuned array of binary weighted PMOS pull-up transistors in parallel with a finely tuned array of non-binary weighted PMOS pull-up transistors;

a second totem pole driver stage having at least one NMOS pull-up transistor and at least one PMOS pull-down transistor therein that are responsive to a second pull-up signal and second pull-down signal, respectively, said at least one NMOS pull-up transistor comprising a coarsely tuned array of binary weighted NMOS pull-up transistors in parallel with a finely tuned array of non-binary weighted NMOS pull-up transistors; and a first resistive element having a resistance value in a range from between about 0 ohms and about 20 ohms, said first resistive element having a first terminal that is electrically coupled to drain terminals of the at least one PMOS pull-up transistor and the at least one NMOS pull-down transistor and a second terminal that is electrically coupled to source terminals of the at least one NMOS pull-up transistor and the at least one PMOS pull-down transistor.

17. The driver circuit of claim 16, wherein a pair of PMOS pull-up transistors in the finely tuned array of non-binary weighted PMOS pull-up transistors have widths equal to: $W+n\beta$ and $W+(n+1)\beta$, where n is a positive integer, $\beta$ is a positive number, $W>4$ $\mu$m and $n\beta<W$.

18. The driver circuit of claim 17, wherein a plurality of PMOS pull-up transistors in the coarsely tuned array of binary weighted PMOS pull-up transistors have widths equal to: W, 2 W and 4 W.

19. An integrated circuit device, comprising:

a first pull-up path having at least one PMOS pull-up transistor therein that is responsive to a first pull-up signal;

a second pull-up path having at least one NMOS pull-up transistor therein that is responsive to a second pull-up signal; and a first resistive element having a first terminal that is electrically coupled to a drain terminal of the at least one PMOS pull-up transistor and a second terminal that is electrically coupled to a source terminal of the at least one NMOS pull-up transistor;

wherein said at least one PMOS pull-up transistor comprises:
a coarsely tuned array of binary weighted PMOS pull-up transistors in parallel with a finely tuned array of non-binary weighted PMOS pull-up transistors; and wherein said at least one NMOS pull-up transistor comprises:
a coarsely tuned array of binary weighted NMOS pull-up transistors in parallel with a finely tuned array of non-binary weighted NMOS pull-up transistors.

20. An integrated circuit device, comprising:

a first pull-down path having at least one NMOS pull-down transistor therein that is responsive to a first pull-down signal;

a second pull-down path having at least one PMOS pull-down transistor therein that is responsive to a second pull-down signal; and a first resistive element having a first terminal that is electrically coupled to a drain terminal of the at least one NMOS pull-down transistor and a second terminal that is electrically coupled to a source terminal of the at least one PMOS pull-down transistor;

wherein said at least one NMOS pull-down transistor comprises:
  a coarsely tuned array of binary weighted NMOS pull-down transistors in parallel with a finely tuned array of non-binary weighted NMOS pull-down transistors; and wherein said at least one PMOS pull-down transistor comprises:
  a coarsely tuned array of binary weighted PMOS pull-down transistors in parallel with a finely tuned array of non-binary weighted PMOS pull-down transistors.

21. An output driver circuit, comprising:

a first totem pole driver stage having at least one PMOS pull-up transistor and at least one NMOS pull-down transistor therein that are responsive to a first pull-up signal and a first pull-down signal, respectively; and a second totem pole driver stage having at least one NMOS pull-up transistor and at least one PMOS pull-down transistor therein that are responsive to a second pull-up signal and second pull-down signal, respectively;

wherein said at least one PMOS pull-up transistor comprises:
  a coarsely tuned array of binary weighted PMOS pull-up transistors in parallel with a finely tuned array of non-binary weighted PMOS pull-up transistors; and wherein said at least one NMOS pull-down transistor comprises:
  a coarsely tuned array of binary weighted NMOS pull-down transistors in parallel with a finely tuned array of non-binary weighted NMOS pull-down transistors.

* * * * *